(12) United States Patent
Wege

(10) Patent No.: US 10,971,340 B2
(45) Date of Patent: Apr. 6, 2021

(54) GAS INJECTOR FOR REACTION REGIONS

(71) Applicant: Stephan Wege, Bannewitz-Cunnersdorf (DE)

(72) Inventor: Stephan Wege, Bannewitz-Cunnersdorf (DE)

(*) Notice: Subject to any disclaimer, the term of this patent is extended or adjusted under 35 U.S.C. 154(b) by 164 days.

(21) Appl. No.: 16/098,886

(22) PCT Filed: May 12, 2017

(86) PCT No.: PCT/DE2017/100403
§ 371 (c)(1),
(2) Date: Apr. 8, 2019

(87) PCT Pub. No.: WO2017/194059
PCT Pub. Date: Nov. 16, 2017

(65) Prior Publication Data
US 2020/0185198 A1    Jun. 11, 2020

(30) Foreign Application Priority Data

May 12, 2016   (DE) ..................... 10 2016 108 845.5

(51) Int. Cl.
| | | |
|---|---|---|
| *H01J 37/32* | (2006.01) | |
| *H01J 37/075* | (2006.01) | |
| *H01J 37/34* | (2006.01) | |
| *C23C 16/455* | (2006.01) | |

(52) U.S. Cl.
CPC ...... *H01J 37/32449* (2013.01); *H01J 37/075* (2013.01); *H01J 37/3467* (2013.01); *C23C 16/4557* (2013.01)

(58) Field of Classification Search
None
See application file for complete search history.

(56) References Cited

U.S. PATENT DOCUMENTS

| 5,614,026 A | * | 3/1997 | Williams | ............ C23C 16/4412 |
|---|---|---|---|---|
| | | | | 118/723 ER |
| 5,851,294 A | * | 12/1998 | Young | ............... C23C 16/45508 |
| | | | | 118/715 |
| 6,013,155 A | * | 1/2000 | McMillin | ............... C23C 16/455 |

(Continued)

FOREIGN PATENT DOCUMENTS

| DE | 251453 A1 | 11/1987 |
|---|---|---|
| DE | 281425 | 8/1990 |

(Continued)

*Primary Examiner* — Amy Cohen Johnson
*Assistant Examiner* — Srinivas Sathiraju
(74) *Attorney, Agent, or Firm* — Smartpat PLC

(57) ABSTRACT

The invention relates to a gas injector (10) for supplying gas or a gas mixture to a reaction region (16). The gas injector (10) contains a main part (12) with a gas channel (14). Furthermore, a gas feed (30) is provided for the gas channels (14). The gas or the gas mixture reaches the reaction region (16) from the gas channel (14) via a first opening (26) or a first group (54) of openings (26) in the main part. The main part (12) is equipped with a second opening (27) or a second group (56) of openings (27) via which the gas of the gas mixture likewise reaches the reaction region (16) from the gas channel (14). Each of the openings (26, 27) or the groups (54, 56) of openings (26, 27) is paired with a respective separate gas feed (30, 40) in the main part (12) on the gas channel (14).

17 Claims, 2 Drawing Sheets

(56) References Cited

U.S. PATENT DOCUMENTS

| | | | |
|---|---|---|---|
| 6,663,025 B1* | 12/2003 | Halsey | C23C 14/566 |
| | | | 118/715 |
| 6,872,259 B2* | 3/2005 | Strang | C23C 16/45565 |
| | | | 118/715 |
| 9,230,815 B2* | 1/2016 | Fu | C23C 16/345 |
| 9,601,339 B2* | 3/2017 | Fu | C23C 16/14 |
| 10,370,761 B2* | 8/2019 | Dunn | C23C 16/45563 |
| 2004/0094090 A1 | 5/2004 | Stadel et al. | |
| 2005/0166843 A1* | 8/2005 | Kools | C23C 16/45565 |
| | | | 118/721 |
| 2006/0051940 A1* | 3/2006 | Todd | H01L 21/02532 |
| | | | 438/478 |
| 2006/0065368 A1* | 3/2006 | Sandhu | C23C 16/45589 |
| | | | 156/345.33 |
| 2006/0065523 A1* | 3/2006 | Hao | H01J 37/3244 |
| | | | 204/298.07 |
| 2006/0133080 A1* | 6/2006 | Goldman | G01N 21/6452 |
| | | | 362/249.01 |
| 2007/0087296 A1* | 4/2007 | Kim | C23C 16/4558 |
| | | | 431/181 |
| 2007/0166966 A1* | 7/2007 | Todd | H01L 21/02381 |
| | | | 438/497 |
| 2008/0264784 A1* | 10/2008 | Pecher | H01J 37/3244 |
| | | | 204/298.07 |
| 2014/0037846 A1* | 2/2014 | Lee | C23C 16/4557 |
| | | | 427/255.28 |
| 2018/0187305 A1* | 7/2018 | Hawrylchak | C23C 16/45587 |
| 2018/0240676 A1* | 8/2018 | Chan | C23C 16/45525 |
| 2019/0177851 A1* | 6/2019 | Ivanov | C23C 16/4584 |

FOREIGN PATENT DOCUMENTS

| | | | |
|---|---|---|---|
| DE | 102004029466 A1 | 1/2006 | |
| DE | 69829390 | 4/2006 | |
| DE | 502004010930 | 2/2008 | |
| JP | H02273535 A | 11/1990 | |
| WO | 9737059 A1 | 10/1997 | |
| WO | 0240741 A1 | 5/2002 | |
| WO | WO-0240741 A1 * | 5/2002 | C23C 16/4557 |
| WO | 02055757 A1 | 7/2002 | |
| WO | 02097870 A2 | 12/2002 | |
| WO | 2006039211 A3 | 1/2007 | |

\* cited by examiner

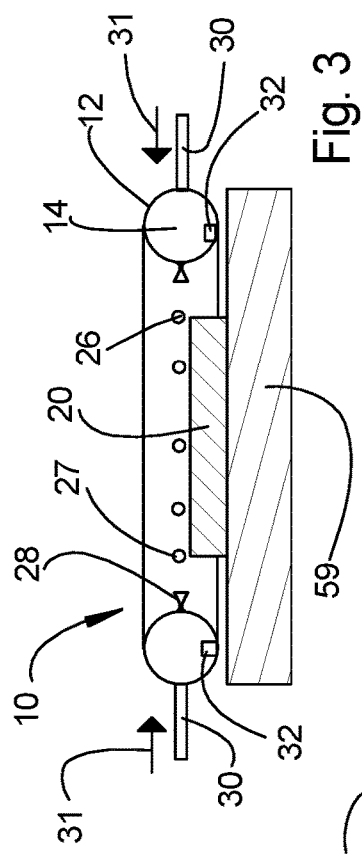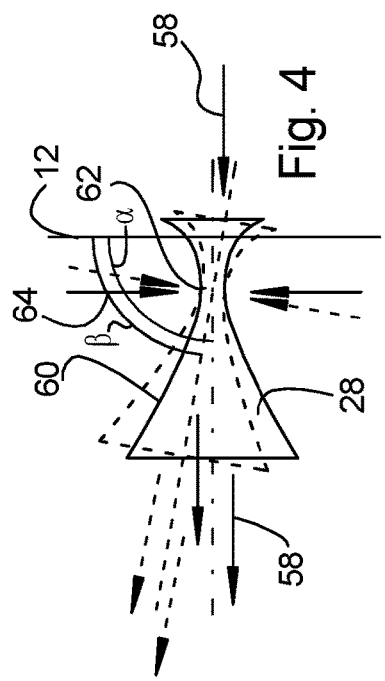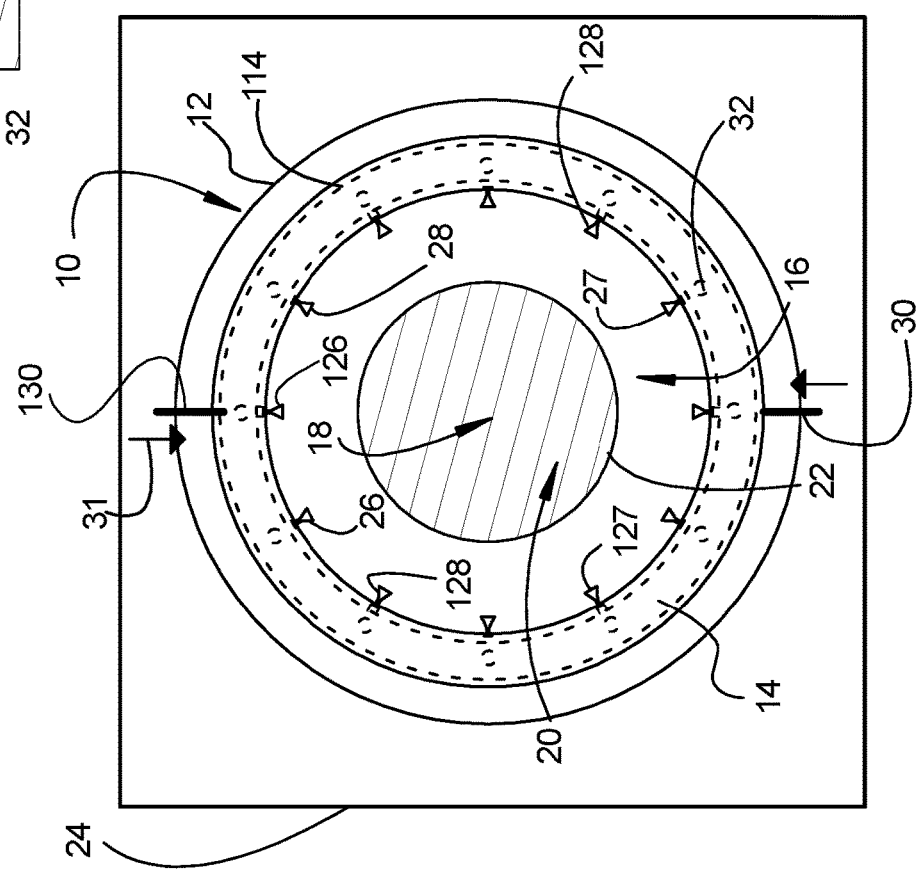

GAS INJECTOR FOR REACTION REGIONS

TECHNICAL FIELD

The disclosure relates to a gas injector for supplying gas or a gas mixture to a reaction region, and more specifically to a gas injector for use in the manufacture of semiconductor-based integrated circuit.

BACKGROUND

Gas injectors are primarily used in the manufacture of semiconductor-based integrated circuits. Here, so-called wafers are exposed to a gas or gas mixture in a reaction region in order to cause single gas molecules to be adsorbed to atomic layers on the substrate surface. For this purpose, the substrates are introduced in a reaction chamber. Via a gas injector, the gas or the gas mixture is introduced into the reaction chamber. It is particularly important that the surface of the substrate adsorbs the gas or gas mixture uniformly. For this, the gas must be brought to the surface very homogeneously and uniformly. In the known gas injectors, it is found that the homogeneity and the uniformity with respect to the flows of the gas during the wetting of the substrate are relatively poor. This is in particular valid when a short gas pulse is used.

Furthermore, such gas injectors are also used in combustion processes such as gas heating. In this case, a uniform combustion process is also important. The gas to be burned should be combined with the oxygen for oxidation as uniformly and homogeneously as possible.

DD 251453 A1 discloses a device for generating atomic particle streams with high intensity by dissociation of gas molecules of a molecular gas in a low-pressure arc discharge. The device consists of a rod-shaped cathode and an anode, provided with an electrical supply. The anode connected to ground potential encloses the cathode, which is insulated by an insulating body from the cathode. The anode is provided with a gas inlet and a gas outlet. The gas outlet is located in the immediate vicinity of one end of the cathode. The anode, the cathode and the insulating body are surrounded by an electrically conductive body, which is electrically insulated against its environment and has a passage for the anode and the cathode and a gas inlet and a gas outlet passage. The gas outlet passage is arranged in the immediate vicinity and concentrically with the gas outlet of the anode.

DD 281425 C4 describes a device for plasma-assisted deposition or removal of thin layers with a cylindrical electrode arrangement. The electrode assembly consists of a housing configured as recipient. The housing is connected to a vacuum generating device which has means for supplying a reaction gas. The housing also contains the charge generating electrodes connected to an RF voltage source. The electrodes are formed as cylinders and arranged coaxially with each other. The inner electrode is designed as a substrate holder. A hollow cylinder made of metal is regularly provided with channels for gas inlet and for suction. Between these channels chambers are incorporated for receiving permanent magnets. This hollow cylinder basket is covered on the outside with a metal jacket and on the inside by a perforated metal jacket. The gas supplies and suctions, which emanate to the outer electrode from collecting channels, are distributed alternately on the circumference and arranged on the end face of the electrode. The plasma space is covered at the ends by plates of highly insulating material with a small dielectric loss angle.

DE 60 2004 010 930 T2 discloses a method and a device for depositing layers. In particular, they serve to produce a conformal thin film on a substrate. The device for producing conformal thin films on a substrate comprises a sputtering plate having a projection. The projection reduces turbulence in an expansion volume belonging to a gas injector. Accordingly, the method of forming conformal thin films on a substrate includes introducing a gas from a gas inlet into an expansion volume belonging to an atomic layer deposition (ALD) assembly. The gas is passed through an atomizer plate adjacent to the expansion volume and a reaction chamber. The atomizer plate includes a protrusion that is opposite the gas inlet, thereby reducing turbulence in the expansion volume.

WO 97/37059 describes a showerhead for uniformly distributing process gas, such as chemically reactive gas over a semiconductor substrate surface to enhance species utilization at the substrate surface. Gas plasma technology is a well-known technique used in the manufacture of integrated circuits. In particular, plasma technology has been used with great success for thin film etching, vapor deposition of films on wafers, photo resist stripping, etc. As is known, it has sometimes proved difficult to ensure uniform distribution of a reactive gas over a wafer during processing. It is particularly problematic to ensure uniform distribution of gas over the semiconductor wafer to perform photo resist stripping. A process chamber is described which has the problem of non-uniform distribution of the reactive species. A gas contains active species and is passed through a central channel into the process chamber. The gas reacts with the surface of the wafer, which is positioned on a plate, and then exits through a central exit channel. The residence time of the gas in the chamber is typically short (for example, a few milliseconds).

WO 02/097870 A2 discloses a diffuser for plasma processing systems. It describes that semiconductor processing systems are used to process semiconductor wafers for integrated circuit fabrication. In etching, oxidizing, chemical vapor deposition (CVD), etc., plasma-based semiconductor processing processes are used. Conventional plasma processing systems control a gas or plasma stream in a plasma processing chamber to provide an optimal environment for processing the wafer. In the processing chamber, the wafer is processed (e.g. with etching, oxidation, CVD, etc.) by exposing the wafer to a gas or plasma which is pumped into and out of the chamber. This process changes the characteristics of the wafer. It is described that the cycle velocity of a chamber in conventional processing systems is generally limited in practice by the maximum local velocity of the incoming and outgoing gases.

From WO 2006/039211 A2 it is known that in a plasma processing system an integrated gas flow control arrangement is provided for connecting a gas distribution system to an injector multi-zone. Channels connect a plurality of valve arrangements in the gas distribution system for gas flow control.

US 2006/006 5368 A1 describes a gas injector with a base body, which is formed as a distribution ring tube. Atomizer nozzles are provided at the distribution ring tube, which lead a gas or a gas mixture into a central reaction space. The distributor ring tube is supplied with gas via a gas supply line. In order to produce the most possible uniform distribution of the gas flow, a distributor element is provided between connections of the distributor ring tube and the gas supplier line. The distributor element is in turn connected to the distributor ring tube via a plurality of parallel gas supply lines. The connections of the distributor ring tube are provided symmetrically around the body.

The known gas injectors have the disadvantage that the distribution of the gas in the reaction region on the openings or group arrangements of openings is not homogeneous and uniform in particular because of different pressure and flow conditions. The cause for this is often the turbulence and friction in the gas channel. Finally, this leads to uneven chemical reactions in the reaction region. Especially with short gas pulses this inequality of gas distribution leads to problems. Often the reaction region, where there is sufficient homogeneity for reactions, is therefore very limited. The size of the substrates, which should react with a gas or gas mixture, such as wafers, is thereby severely limited.

In addition, the inhomogeneity and irregularity of the gas ultimately have the consequence that in particular the required reaction time with a substrate or other chemical elements in the reaction region is uneven. This lengthens the residence times during the treatment process.

SUMMARY

Thus, an object of the invention is to eliminate the disadvantages of the prior art and to provide a gas injector, which has a compact design. In doing so, a reaction region should be present, in which the distribution of a required gas or gas mixture to the reaction in the reaction region is distributed as equal as possible.

The object is achieved in a gas injector which comprises a base body and a gas channel formed within the base body. A plurality of openings are provided in the base body via which the gas or the gas mixture passes from the gas channel into the reaction region. Those include a first opening or a first group arrangement of openings and a second opening or a second group arrangement of openings. A plurality of gas supplies includes a first gas supply allocated to the first opening or group arrangement of openings in the base body, and a second gas supply allocated to the second opening or group arrangement of openings in the base body. The second gas supply is provided as a bypass of the first gas supply, the bypass being arranged in the base body.

In a single gas supply, as it is often used in the prior art, an unequal distribution concerning the gas or gas mixture flowing into the reaction region often occurs at the gas channel induced by flow, temperature and especially pressure. The invention is therefore based in particular on the principle of eliminating this unequal distribution towards the reaction region. It has surprisingly been found that it is particularly advantageous to allocate a separate gas supply to each opening or group arrangement of openings of the gas injector. In this way, the pressure and flow distribution can be made much more homogeneous in the reaction region. On the one hand, this considerably shortens the reaction times with a substrate, which means that very short gas pulse times can be achieved. The gas pulse time is the time in which the gas is in the reaction region to react with the substrate surface. By arranging a separate gas supply in the base body, it is possible to clearly define how the gas has to flow through the gas channels already during the production of the gas injector.

On the other hand, the distribution of the gas or the gas mixture on the substrate surface in the reaction region is also considerably more uniform. The turbulence and friction in the gas channel are minimized by this measure. Thus, there is a significantly higher homogeneity of the gas in the gas channel and thus also in the reaction region. A separate gas supply designed as a bypass of another gas supply helps to save resources. It is no longer necessary that an own gas resource is allocated to each opening or group arrangement of openings for supplying the separate gas supplies. Rather, one gas resource can be used in this way, which supplies all openings or group arrangements of openings.

By arranging the bypass in the base body, a compact construction can be achieved. As a side effect the flow of the inlet is optimized. In doing so, a significantly higher quality of the reaction between gas and substrate can be achieved. Preferably, the bypass is parallel to the first gas channel. On the one hand the bypass can be provided besides and on the other hand below or above the gas channel in the base body.

In order to obtain a particularly uniform flow, the gas supply configured as a bypass can have a different diameter and/or length than the first gas channel. With the different diameters or lengths additional parameters are provided to optimize the flow to the openings or groups of openings in view of uniform flow distribution at the openings. In this case, if necessary, the diameter can also vary within a gas channel, in particular also in the bypass.

A preferred embodiment of the gas injector further consists in that the diameter and/or the length of the gas supplies are adjustable and/or changeable. Additionally, the variability of the diameters and/or the length of the gas supplies enables the optimization of the gas flow in terms of homogeneity. The gas or gas mixture reaches the openings or the groups of openings very evenly.

In a particularly preferred embodiment of the gas injector, the reaction region is provided in a closed reaction chamber. As a result, the reaction chamber can be limited and kept free from interference by external influences, such as unwanted gases or gas mixtures. In principle, the reaction chamber can be designed, for example, for wafer processing in semiconductor-integrated circuits as a vacuum, in order to, for example, specifically introduce gases into this reaction chamber. The gases may react with the surface of the wafer to deposit a thin atomic layer or atomic layers.

An advantageous embodiment of the gas injector is achieved in that the opening or the openings in the base body are each configured as a Laval nozzle. When flowing through the openings, the gas or gas mixture enters the reaction region. It turns out that Laval nozzles have particularly good flow properties in order to achieve a homogeneous gas distribution in the reaction region.

In order to further optimize the gas inlet into the reaction region, the exit angle of the opening or the openings is configured adjustable in a horizontal and/or a vertical direction in an advantageous embodiment of the gas injector. In doing so, homogeneity of the gas or gas mixture in the reaction region can be established more specifically. By suitable adjustment of the direction of flow of the gas from the openings into the reaction region, in particular flow, temperature and pressure-dependent inhomogeneous distributions in the reaction region can additionally be compensated.

Preferably, not only the directions of the exit angles of the opening or the openings can be varied for optimizing the gas inflow, but also the flow velocity. For this purpose, the opening angle and/or the opening diameter of the opening or the openings is configured variable in an expedient embodiment of the gas injector. Thus, the user has another parameter to influence the flow in the reaction region in order to obtain a sufficient homogeneity in the largest possible region.

In order to obtain a further parameter which can be optimized for controlling the gas inlet into the reaction region, a heater for heating the gas is provided in an advantageous embodiment of the gas injector. The temperature can be used to vary the gas pressure, in particular in the base body or in the gas channel. For this purpose, in a further expedient embodiment of the invention a heater is provided at each opening, which is individually controllable and heatable.

A preferred embodiment of the gas injector consists in that a temperature measuring sensor is provided which monitors the temperature of the gas injector for controlling the heater. The respective temperature can be determined via the temperature measuring sensor. Based on the measured temperature values the heater can be controlled and optimized accordingly.

In a further advantageous embodiment of the gas injector, a pressure measuring sensor is provided which monitors the gas pressure of the gas injector for controlling the gas pressure. The pressure measuring sensor can be used to determine which pressure is present. Here, pressure fluctuations can be determined and evaluated. However, by means of the pressure measuring sensor a control of the pressure can also be realized. If, for example, the pressure is too low, the pressure can be optimized via the heater if it is activated accordingly. The influx of gas resources can also be regulated.

A special embodiment of the gas injector is preferably that the gas injector has an annular or polygonal structure, wherein the exit angle of the opening or the openings are each centrally aligned. The arrangement proves to be particularly good, since it can easily be used to define a limited reaction region in the interior of the annular or polygonal structure. This reaction region can be optimized specifically for the gas flow.

Gas injectors often present relatively large problems because they deform when exposed to heat. This deformation can occur both during operation of the gas injector, as well as in the production. A particularly advantageous embodiment of the gas injector therefore consists in that the gas injector comprises a ceramic base body. Although gas injectors made of this material are relatively brittle, they are extremely heat-resistant. In addition, ceramic materials, such as aluminum oxide, zirconium oxide, yttrium oxide, which are very resistant to plasma and usually chemically resistant with a low sputtering rate. Therefore, these materials also withstand very aggressive etching gases, such as halogens. They practically do not deform at all for the field of application.

Finally, a preferred embodiment of the gas injector is achieved in that the openings or group arrangements of openings are arranged symmetrically on the base body. Symmetrical arrangements can be calculated and optimized particularly well. In this respect, the symmetrical arrangement of the openings on the base body for generating a uniform and homogeneous gas flow in the reaction region is particularly suitable.

In an advantageous embodiment of the gas injector, a second gas channel is provided, which is parallel to the first gas channel and arranged in the base body, wherein openings or a group arrangement of openings are provided for the second gas channel via which a second gas or gas mixture passes from the second gas channel into the reaction region independently of the first gas channel. By this measure, further parameters in the reaction region of the gas injector can be varied, so as to achieve a suitable reaction with a substrate. In this case, the gas channels, for example, can also be pulsed alternately or alternately in different sequences with the different gases. Further on, the gas pressures of the individual gas channels can each vary.

Further embodiments and advantages will become apparent from the subject of the dependent claims, as well as the drawings with the accompanying descriptions. Embodiments are explained below in more detail and with reference to the accompanying drawings. The invention should not be limited to the embodiments. These are only basic and exemplary implementations of the gas injector. Rather, embodiments are also considered, which now and in the future will appear to the skilled person in an equivalent manner with other technical means.

BRIEF DESCRIPTION OF THE DRAWINGS

FIG. 3 shows in a schematic sketch a section of a gas injector with Laval nozzles.

FIG. 4 shows in a schematic sketch a section of a variable Laval nozzle, as used in the gas injector.

FIG. 5 shows a schematic sketch of an annular gas injector, in which a second separate gas supply is provided with openings that are independent of the first gas supply.

DETAILED DESCRIPTION

Figure 1:
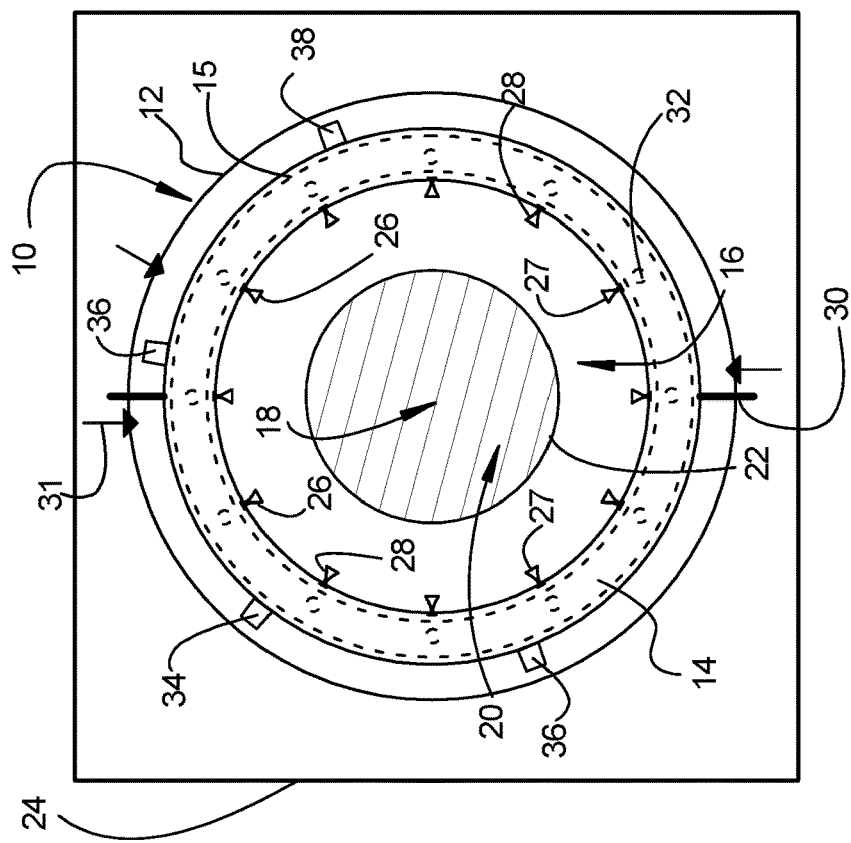
FIG. 1 shows in a schematic sketch an annular gas injector, in which each opening is associated with a gas supply.

In FIG. 1, a gas injector is designated with 10. The gas injector 10 is shown in a schematic sketch. The gas injector 10 consists of an annular base body 12, in which a likewise annular gas channel 14 is provided. The base body 12 has a second gas channel 15, which is arranged parallel to and below the first gas channel 14. The second gas channel 15 is shown in dashed lines. The second gas channel 15 may alternatively be arranged next to or above the first gas channel 14. The base body 12 is made of a ceramic material. The ceramic material is extremely heat resistant, as it is regularly necessary for the requirements of the gas injector 10. The base body 12 is arranged around a reaction region 16. In the interior, the center 18 of the reaction region 16 there is a substrate 20, which is formed, for example, as a wafer 22 in the present embodiments. The reaction region 16 is provided in a reaction chamber 24. The substrate 20 should react as uniformly as possible with a reaction gas in the reaction region 16.

The base body 12 of the gas injector 10 therefore has openings 26, 27 which point towards the center 18 of the reaction region 16. The openings 26, 27 are arranged symmetrically in the base body 12. A portion of the openings 26, 27 is connected to the first gas channel 14. Another portion of the openings 26, 27 is connected to the second gas channel 15. Via this the gas or gas mixture is led homogeneously into the reaction region 16.

The cross section or the diameter of the gas channels 14, 15 may be formed differently from each other. In the present embodiment, the cross section of the subjacent second gas channel 15 is formed smaller than the cross section of the first gas channel 14. As a result, different flow velocities in the individual gas channels 14, 15 can be achieved. This can be configured adjustable, for example, by tapering or widening the cross section with an expanding body in one of the gas channels 14, 15, such as a piezoelectric crystal. By applying different voltages the volume of a piezoelectric crystal can be varied. This can then be used to change the diameter or cross section of the gas channels 14, 15, through which the gas or gas mixture flows.

In the present embodiment the openings 26, 27 are formed as Laval nozzles 28. The Laval nozzles 28 facilitate an optimal flow of a reaction gas from the gas channel 14 into the reaction region 16. The vertical and horizontal exit angle α, β of the Laval nozzles 28 is variably adjustable, as can be seen in FIG. 4. Furthermore, the cross-section of the Laval nozzles 28 can be varied to optimize the inflowing gas into the reaction region 16.

On the base body 12 gas supplies 30 for the annular gas channels 14, 15 are arranged. In order to find the most uniform and homogeneous gas distribution at the openings 26, 27, a separate gas supply 30 is associated in the region of each opening 26, 27. This avoids or substantially reduces the possibility of local pressure fluctuations in the gas channels 14, 15. The arrows 31 indicate the direction of the reaction gas flowing into the gas channel 14.

The reaction chamber 24 is usually pumped empty of all gases. Only the gas enters, which is led from a not shown gas resource via the gas supplies 30 and the gas channel 14 and through the openings 26, 27 into the reaction region 16 for reaction with the substrate 20. Each of the gas supplies 30 is connected to such a gas resource.

In the gas channel 14 heaters 32 are provided for locally heating the reaction gas. Each of the heaters 32 can be controlled individually for local heating of the reaction gas. The heating of the reaction gas also allows optimizing the local pressure in the gas channel 14 for a uniform exit through the openings 26, 27.

Pressure sensors 34 and temperature sensors 36 monitor the pressure or temperature in the gas channel 14. The measured values detected by the pressure sensors 34 and temperature sensors 36 are also used, in particular, to control the heaters 32 and the Laval nozzles 28 for optimization. By the flow sensors 38, the flow conditions in the gas channel 14 can be determined.

Figure 2:
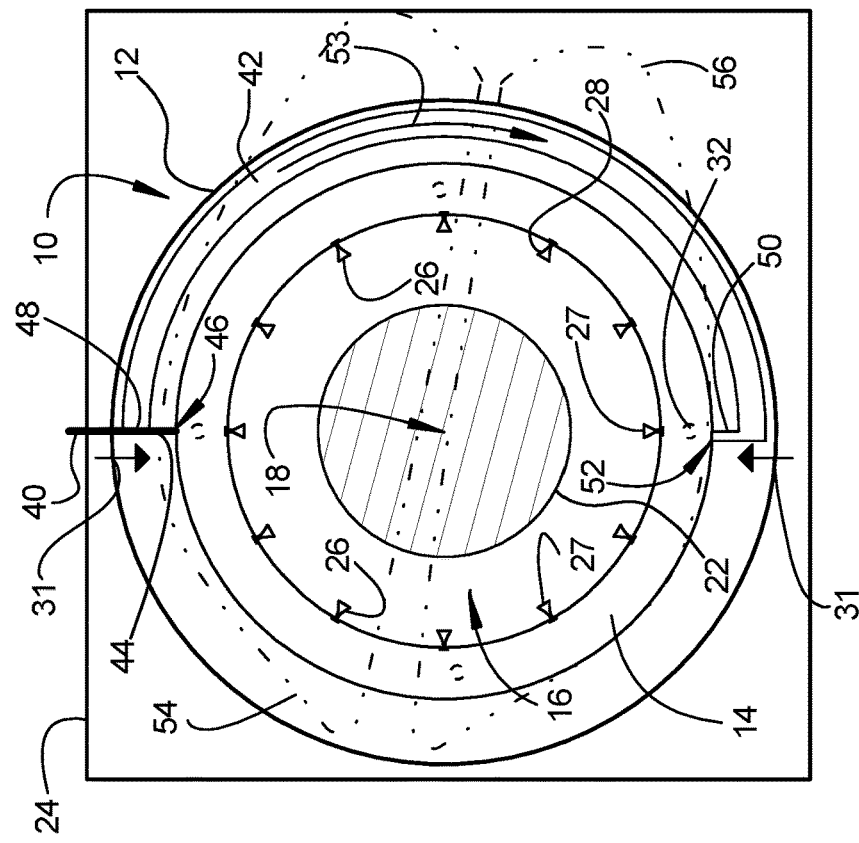
FIG. 2 shows in a schematic sketch an annular gas injector with a gas supply and a bypass.

FIG. 2 shows a further exemplary embodiment of the gas injector 10. While in the embodiment of FIG. 1 each opening 26, 27 has been allocated to a single gas supply 30, in the present embodiment according to FIG. 2, a single gas supply 40 is sufficient. Instead of the individual gas supplies 30, a bypass 42 is provided parallel to the gas channel 14. As far as FIG. 2 corresponds to FIG. 1 the same reference numerals are chosen. The gas injector 10 is located in the reaction chamber 24. The substrate 20 is located in the reaction region 16 of the reaction chamber 24.

The gas supply 40 is attached to the base body 12 and connected to the gas channel 14 with a first connecting part 44 at the junction 46. At the first connecting part 44 a branch 48 is provided, which opens into the bypass 42. In the present exemplary embodiment, the bypass 42 leads to a second connection part 50 opposite the junction 46 at a further junction 52 to the gas channel 14. The connecting part 50 is also connected to the gas channel 14 of the base body 12 and the bypass 42. The flow direction through the bypass 42 is indicated here by an arrow 53.

The reaction gas then flows via the two junctions 46, 52 into the gas channel 14 of the base body 12. The gas is then passed through the Laval nozzles 28 of the openings 26, 27 in the reaction region 16. The gas injector 10 has in this arrangement, by design, only one gas supply 40, which is distributed via the bypass 42 to the junctions 46, 52. The openings 26, 27 therefore form two groups of arrangements 54, 56, which are indicated by dashed lines. In this case, one half of the openings 26, 27 of the group arrangement 54 are rather supplied via the junction 46 and the other half of the openings 27 of the group arrangement 56 with reaction gas via the junction 52. As a result, a better distribution of the reaction gas in the gas channel 14 is effected in terms of flow. In this embodiment the heaters 32 in the gas channel 14 of the base body 12 are provided in a smaller number compared to the embodiment of FIG. 1. But the operation of the heaters 32 is identical to the previous embodiment of FIG. 1.

FIG. 3 shows a schematic sketch of the section of the gas injector 10 with the Laval nozzles 28 according to FIG. 1. From the not shown gas resources, gas is supplied via the gas supplies 30 into the gas channel 14 of the base body 12. The annular base body 12 of the gas injector 10 encloses the substrate 20 in the reaction region 16. The substrate 20 is located on a substrate holder 59. Via the openings 26, 27, the gas reaches the substrate 20. The Laval nozzles 28 arranged radially symmetrical help to ensure uniform flow distribution of the gas in the reaction region 16. The heaters 32 are also schematically shown in the gas channel 14. The heaters 32 can change the gas pressure by heating the gas. As a result, the pressure in the gas channel 14 can be regulated or adjusted as optimally as possible with a suitable control which is known to the person skilled in the art.

In FIG. 4, the section of the variable Laval nozzle 28 as used in the gas injector 10 is shown in a schematic sketch. The gas flows through the Laval nozzle 28. It flows out in each case in a certain vertical exit angle α and horizontal exit angle β with respect to a tangential surface of the base body 12 in the region of the opening 26, 27. There, the reaction gas wets the substrate 20. With the illustration of FIG. 4, the adjustability of the exit direction 58 of the gas flowing out from the Laval nozzle 28 shall be indicated. For the sake of simplicity, only the vertical exit angle α is shown here. The dashed line indicates an example of a modified exit angle α'. Simplified, the Laval nozzle 28 is similar to a tube 60, which is tapered at a point 62 in cross-section. Arrows 64 indicate that the narrowing 62 is variable and adjustable in cross-section. The arrows 64 are intended to indicate the variability in the narrowing 62. As a result, the flow rate through the Laval nozzles 28 can be adjusted if necessary.

FIG. 5 describes a further exemplary embodiment of the gas injector 10. As far as the figure matches the previous figures, the same reference numerals are used. In contrast to the previous FIGS. 1 and 2, at least two independent gas channels 14, 114 are provided in the base body 12. These independent gas channels 14, 114 are each also fed with a gas by independent gas supplies 30, 130. The type of gas or gas mixture may be different and vary in each case with the gas supplies 30, 130. Openings 26, 27 of the first gas channel 14 alternate with openings 126, 127 of the second gas channel 130 in the present embodiment and are each configured as Laval nozzles 28, 128. The arrangements of the openings 26, 27, 126, 127 may, however, also vary in each case. The Laval nozzles 28, 128 in turn facilitate an optimal inflow of the reaction gases from the gas channels 14, 114 into the reaction region 16. The vertical and horizontal exit angle α, β of the Laval nozzles 28 is variably adjustable, as can be seen in FIG. 4. Furthermore, the cross-section of the Laval nozzles 28, 128 can be varied to optimize the gas inflowing in the reaction region 16.

If necessary, the independent gas channels 14, 114 can also be supplied with different gas pressures in order to finally effect a suitable reaction in the reaction region 16 of the reaction chamber 24 with the substrate 20.

| LIST OF REFERENCE NUMERALS | |
|---|---|
| 10 | gas injector |
| 12 | annular base body |
| 14 | first gas channel |
| 15 | second gas channel |
| 16 | reaction region |
| 18 | center of the reaction region |
| 20 | substrate |
| 22 | wafer |
| 24 | reaction chamber |
| 26, 27 | openings |
| 28 | Laval nozzles |
| 30 | gas supplies |
| 31 | arrows of flow direction |
| 32 | heaters |
| 34 | pressure sensors |
| 36 | temperature sensors |
| 38 | flow sensors |
| 40 | gas supply |
| 42 | bypass |
| 44 | first connection part |
| 46 | junction |
| 48 | branch |
| 50 | second connection part |
| 52 | junction |
| 53 | arrow of flow direction in bypass |
| 54, 56 | group arrangement |
| 58 | exit direction |
| 59 | substrate holder |
| 60 | tube |
| 62 | narrowing in cross section |
| 64 | arrows |
| 114 | second independent gas channel |
| 126 | openings |
| 127 | openings |
| 128 | Laval nozzles |
| 130 | gas supplies |

The invention claimed is:

1. A gas injector for supplying a gas or a gas mixture to a reaction region, comprising:
a base body;
a gas channel formed within the base body;
a plurality of openings in the base body via which the gas or the gas mixture passes from the gas channel into the reaction region, including
a first opening or a first group arrangement of openings and
a second opening or a second group arrangement of openings; and
a plurality of gas supplies, including
a first gas supply allocated to the first opening or group arrangement of openings in the base body, and
a second gas supply allocated to the second opening or group arrangement of openings in the base body,
wherein the second gas supply is provided as a bypass of the first gas supply, the bypass being arranged in the base body, and
wherein the gas injector has an annular or polygonal structure, and
wherein exit angles ($\alpha$, $\beta$) of the openings are each centrally aligned.

2. The gas injector for supplying gas or a gas mixture to a reaction region according to claim 1,
wherein a diameter and/or a length of the second gas supply and a diameter and/or a length of the gas channel are different.

3. The gas injector for supplying gas or a gas mixture to a reaction region according to claim 2,
wherein the diameter and/or the length of the second gas supply is adjustable and/or changeable.

4. The gas injector for supplying gas or a gas mixture to a reaction region according to claim 1,
wherein the reaction region is provided in a closed reaction chamber.

5. The gas injector for supplying gas or a gas mixture to a reaction region according to claim 1,
wherein the openings are configured as a Laval nozzles.

6. The gas injector for supplying gas or a gas mixture to a reaction region according to claim 1,
wherein the exit angles ($\alpha$, $\beta$) of the openings are adjustable in a horizontal and/or vertical direction.

7. The gas injector for supplying gas or a gas mixture to a reaction region according to claim 1,
wherein an opening angle and/or an opening diameter of the openings is variable.

8. The gas injector for supplying gas or a gas mixture to a reaction region according to claim 1,
wherein a heater is provided for heating the gas or the gas mixture.

9. The gas injector for supplying gas or a gas mixture to a reaction region according to claim 8,
wherein a temperature measuring sensor is provided which monitors a temperature of the gas injector for controlling the heater.

10. The gas injector for supplying gas or a gas mixture to a reaction region according to claim 1,
wherein individually controllable heaters are provided at each of the plurality of opening for heating the gas or gas mixture.

11. The gas injector for supplying gas or a gas mixture to a reaction region according to claim 1,
wherein a pressure measuring sensor is provided which monitors a gas pressure of the gas injector for controlling the gas pressure.

12. The gas injector for supplying gas or a gas mixture to a reaction region according to claim 1,
wherein the base body is a ceramic base body.

13. The gas injector for supplying gas or a gas mixture to a reaction region according to claim 1,
wherein the openings are arranged symmetrically on the base body.

14. The gas injector for supplying gas or a gas mixture to a reaction region according to claim 1, further comprising
a second gas channel which is arranged parallel to the gas channel in the base body,
wherein further openings are provided for the second gas channel via which a second gas or gas mixture passes from the second gas channel into the reaction region independently of the gas channel.

15. The gas injector for supplying gas or a gas mixture to a reaction region according to claim 1,
wherein an exit direction of the openings is generally horizontal.

16. The gas injector for supplying gas or a gas mixture to a reaction region according to claim 1,
wherein the openings are arranged on an inner side of the gas injector in a common horizontal plane.

17. The gas injector for supplying gas or a gas mixture to a reaction region according to claim 1,
wherein the gas injector surrounds the reaction region.

* * * * *